US006987442B2

(12) United States Patent
Pisarsky et al.

(10) Patent No.: US 6,987,442 B2
(45) Date of Patent: Jan. 17, 2006

(54) MOTOR-KINETIC IDENTIFICATION APPARATUS AND METHOD

(75) Inventors: Valdimir R. Pisarsky, Sunnyvale, CA (US); Mark B. Hoffberg, Palo Alto, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 148 days.

(21) Appl. No.: 10/185,452

(22) Filed: Jun. 28, 2002

(65) Prior Publication Data

US 2004/0001393 A1 Jan. 1, 2004

(51) Int. Cl.

| | |
|---|---|
| ***H04Q 9/00*** | (2006.01) |
| ***H03M 11/00*** | (2006.01) |
| ***G09G 5/08*** | (2006.01) |
| ***G05B 15/00*** | (2006.01) |
| ***G06F 19/00*** | (2006.01) |

(52) U.S. Cl. ...................... 340/5.82; 340/5.52; 341/32; 341/20; 345/161; 700/85; 463/38; 74/471

(58) Field of Classification Search ............... 340/5.82, 340/5.52; 341/32, 20; 345/161; 700/85; 463/37, 38; 74/471; 710/345; 200/5, 6 A; 273/148

See application file for complete search history.

(56) References Cited

U.S. PATENT DOCUMENTS

| | | | | |
|---|---|---|---|---|
| 4,857,916 | A * | 8/1989 | Bellin | 340/5.52 |
| 5,559,504 | A * | 9/1996 | Itsumi et al. | 340/5.53 |
| 5,793,881 | A * | 8/1998 | Stiver et al. | 382/115 |
| 5,796,354 | A * | 8/1998 | Cartabiano et al. | 341/22 |
| 5,964,265 | A | 10/1999 | Becherer | |
| 6,286,242 | B1 * | 9/2001 | Klebes | 42/84 |
| 6,324,310 | B1 * | 11/2001 | Brownlee | 382/312 |
| 6,589,117 | B1 * | 7/2003 | Moritome et al. | 463/37 |

FOREIGN PATENT DOCUMENTS

WO WO 01 94168 12/2001

* cited by examiner

*Primary Examiner*—Michael Horabik
*Assistant Examiner*—Scott Au
(74) *Attorney, Agent, or Firm*—Adam L. Stroud

(57) ABSTRACT

A motor-kinetic identification apparatus includes a pliant material, a source of a magnetic field embedded in the pliant material and a magneto metric element embedded in the material. The pliant is adapted to be gripped by a user. The pliant material has a normally biased rest shape and the shape becomes deformed upon the material being gripped. The magnetic field has a field contour dependent on said shape of said material. The magneto metric element is disposed within the field and has a detectable state commensurate with the magnetic field contour.

16 Claims, 2 Drawing Sheets

MOTOR-KINETIC IDENTIFICATION APPARATUS AND METHOD

FIELD OF THE INVENTION

The present invention relates generally to personal identification apparatus and methods and more particularly to motor-kinetic identification apparatus and methods.

DESCRIPTION OF THE RELATED ART

Personal identification apparatus and methods are known for providing security such as fingerprint and retina scanners. Known apparatus and method have both advantages and limitations that determine their respective applications, costs and level of security provided.

For example, a commercial office complex may require only a low level of security to ensure that only authorized personnel, employees and escorted guest, are on the premises. Such security may be provided by employee issued cards that function both as an ID card and also as a smart card or other type of card detectable by a sensor. Sensors may be placed at doorways and other ingress and egress points, such as elevators and parking lot gates such that the sensor need detect a valid card before door locks and other equipment becomes operable to permit passage.

A disadvantage and limitation of such cards and sensors is that an employee may forget, misplace or lose a card. A forgotten or misplaced card may only prevent a minor or temporary inconvenience to the employee. More seriously, a card found by an unauthorized individual may be used to gain access to the premises.

To prevent loss of cards, fingerprint and retina scanners may be utilized. Although fingerprint and retina scanners may provide exceptionally high levels of security, they are relatively expensive for many applications. In environments where high level of security, and the high cost associated therewith, is not warranted, such as the commercial office complex, other apparatus and methods are needed.

Accordingly, there exists a need to provide a security apparatus and method that overcomes one or more of the disadvantages and limitations discussed above. In particular, a need exists to provide a security apparatus and method that provides a low level of security but obviates the need for smart and sensor type ID cards.

SUMMARY OF THE INVENTION

According to the present invention, a motor-kinetic identification apparatus includes a pliant material, a source of a magnetic field embedded in the pliant material and a magneto metric element embedded in the material. The pliant is adapted to be gripped by a user. The pliant material has a normally biased rest shape and the shape becomes deformed upon the material being gripped. The magnetic field has a field contour dependent on said shape of said material. The magneto metric element is disposed within the field and has a detectable state commensurate with the magnetic field contour.

In another embodiment of the present invention, a motor-kinetic identification method includes developing a magnetic field contour within a pliant material, continuously detecting the field contour as the material is being gripped to develop a user stereotype, and comparing the user stereotype to stored user stereotypes.

A feature of the present invention is that the pliant material, when shaped to form a handle or knob that is gripped by the user, relies on the fact that the motor-kinetic behavior of the human hand is unique enough for each individual that it may be relied upon to identify such individual. A sensor, as described in detail below, embedded in the pliant material thus senses the relative contact location and temporal pattern of the user's grip when grasping the pliant material.

Advantages of the present invention is that the pliant material may be shaped to provide any type of knob or handle for building doors, car doors, guns, joysticks and the like. Accordingly, the present invention provides a relatively low cost apparatus and method for providing security.

These and other objects, advantages and features of the present invention will become readily apparent to those skilled in the art from a study of the following Description of the Exemplary Preferred Embodiments when read in conjunction with the attached Drawing and appended Claims.

DESCRIPTION OF THE EXEMPLARY PREFERRED EMBODIMENT

Figure 1:
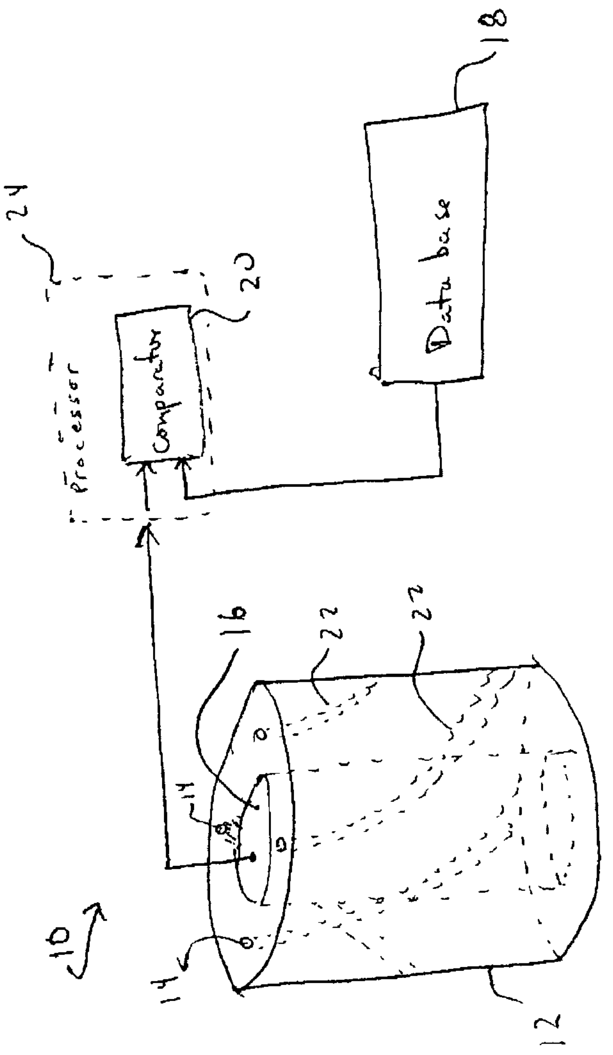
FIG. 1 is a schematic diagram of an identification apparatus constructed according to the principles of the present invention.

Referring now to FIG. 1, there is shown a motor-kinetic identification apparatus 10 including a pliant material 12, a source 14 of a magnetic field embedded in the material 12 and a magneto metric element 16 embedded in the material 12. The material 12 is adapted to be gripped by a user and has a normally biased rest shape. The shape of the material 12 is deformed upon the material 12 being gripped by a user. The magnetic field has a field contour dependent on the shape of the material 12. The magneto metric element 16 is disposed within the field and has a detectable state commensurate with the contour of the field.

As the material 12 is being gripped, the material 12 deforms as a function of time. Accordingly, the contour of the field becomes time variant resulting in the detectable state of the magneto metric element also being time variant. The time variant detectable state defines a unique stereotype for each user.

The identification apparatus 10 may further include a database 18 in which the unique stereotype for each user is stored. To identify a particular user, the identification apparatus may also include a comparator 20 to which the currently developed time variant detectable state is applied and to which each stored stereotype is sequentially applied.

In one particular embodiment of the present invention, the material 12 may be a non-magnetic foam material. In another particular embodiment of the present invention, the source 14 may include strips 22 of magnetic material.

The user stereotype available from the magneto metric element may be applied to a processor 24, which does the comparing of the current user stereotype to the stored user stereotypes in the database. The user stereotype available from the magneto metric element may be time sampling of the time variable out put state. In one embodiment of the present invention, processor 24 is operative to time sample the time variant output state of the magneto metric element.

Figure 2:
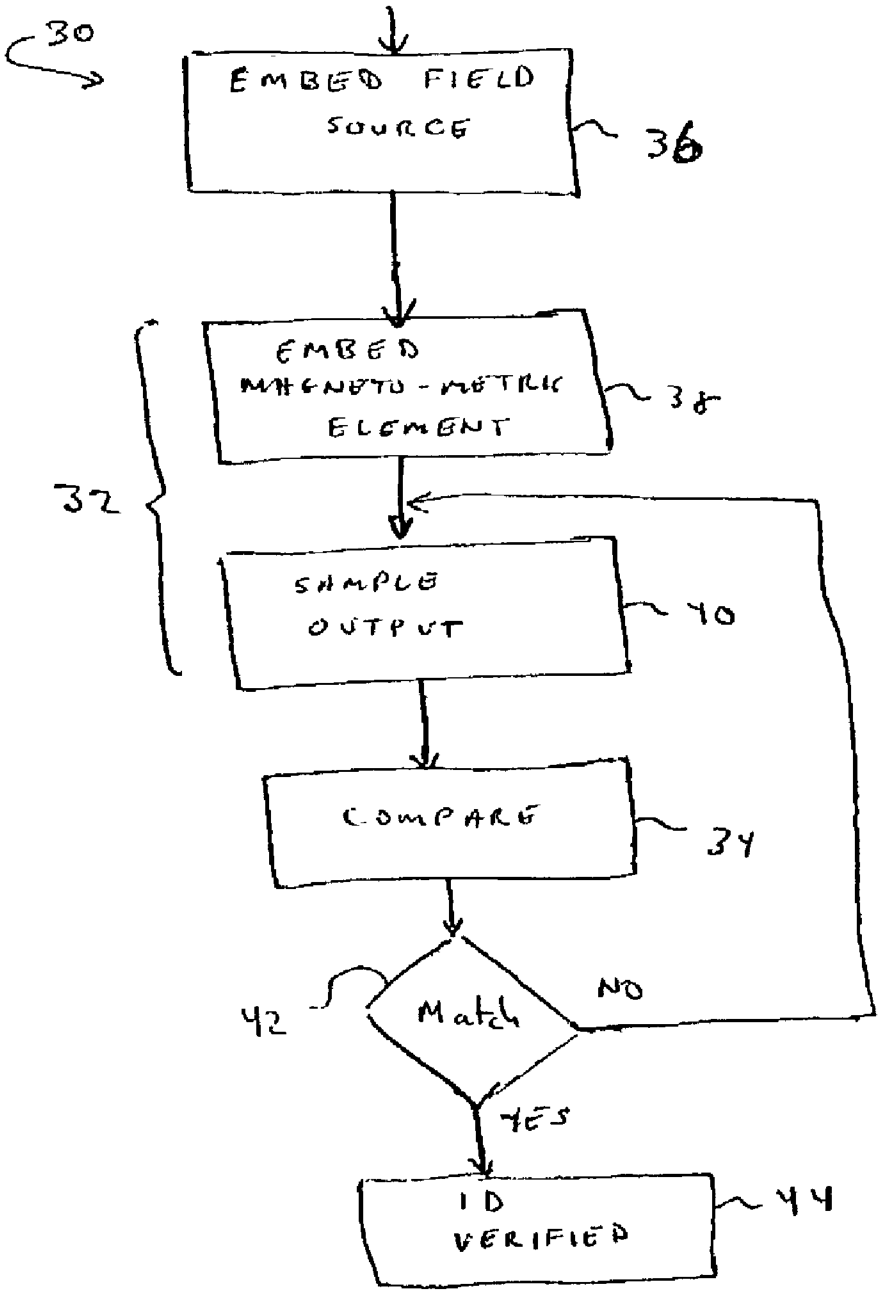
FIG. 2 is a flowchart useful to describe the method of the present invention.

Referring now to FIG. 2, a motor-kinetic identification method includes developing a magnetic field contour within the pliant material 12, as indicated at step 30, continuously detecting the field contour as the pliant material 12 is being gripped to develop a user stereotype, as indicated at step 32, and comparing the user stereotype to stored user stereotypes, as indicated at step 34. The developing step 30 may include embedding the magnetic field source 14 in the material 12, as indicated at step 36. The embedding step may include embedding strips 22 of the magnetic material into the pliant material 12.

The detecting step 32 may include embedding the magneto metric element 16 in the pliant material 12 and disposed within the field contour, as indicated at step 38, and continuously detecting an output state of the magneto metric element 16, as indicated at step 40. The output state detecting step 40 may include time sampling the output state, as indicated at step 42.

The method may further include developing for each of a plurality of users a respective one of the user stereotypes from the time sampled output state, and storing the user stereotypes in a database.

There has been described above preferred exemplary embodiments of a novel identification apparatus and method. Those skilled in the art may now make numerous use of and departures from the above described exemplary preferred embodiments without departing from the novel principles of the present invention described herein. Accordingly, the present invention is to be described solely by the scope of the appended Claims.

What is claimed as the invention is:

1. A motor-kinetic identification apparatus comprising:

a pliant material adapted to be gripped by a user, the material having a normally biased rest shape, the shape being deformed upon the material being gripped;

a source of a magnetic field embedded in the material, the field having a field contour dependent on the shape of the material;

a magneto metric element embedded in the material, the element being disposed within the field and having a detectable state commensurate with the contour; and wherein the contour is time variant as the material is being gripped such that the detectable state is time variant.

2. A motor-kinetic identification apparatus as set forth in claim 1 wherein the time variant detectable state defines a unique stereotype for each user.

3. A motor-kinetic identification apparatus as set forth in claim 2 further comprising:

a database in which the unique stereotype for each user is stored;

a comparator to which the time variant detectable state is applied and to which each stored stereotype is sequentially applied.

4. A motor-kinetic identification apparatus as set forth in claim 1 wherein the material is non-magnetic foam.

5. A motor-kinetic identification apparatus as set forth in claim 1 wherein the source includes strips of magnetic material.

6. A motor-kinetic identification method comprising:

developing a magnetic field contour within a pliant material;

continuously detecting the field contour as the material is being gripped to develop a user stereotype that is a time variant detectable state; and comparing the user stereotype to stored user stereotypes.

7. A motor-kinetic identification method as set forth in claim 6 wherein the developing includes embedding magnetic material in the material.

8. A motor-kinetic identification method as set forth in claim 7 wherein the embedding includes embedding strips of the magnetic material into the material.

9. A motor-kinetic identification method as set forth in claim 6 wherein the detecting includes:

embedding a magneto metric element in the material and disposed within the field contour; and continuously detecting an output state of the magneto metric element.

10. A motor-kinetic identification method as set forth in claim 9 wherein detecting the output state includes time sampling the output state.

11. A motor-kinetic identification method as set forth in claim 10 further comprising:

developing for each of a plurality of users a respective one of the user stereotypes from the time sampled output state; and storing the user stereotypes in a database.

12. A motor-kinetic identification apparatus comprising:

a pliant material adapted to be gripped by a user, the material having a normally biased rest shape, the shape being deformed upon the material being gripped;

a source of a magnetic field embedded in the material, the field having a field contour dependent on the shape of the material;

a magneto metric element embedded in the material and further disposed within the field contour and operable to develop a user stereotype as the material is gripped;

wherein the contour is time variant as the material is being gripped such that the user stereotype is time variant;

a database of stored user stereotypes; and a processor to which the user stereotype is applied and operable to compare the user stereotype to the stored user stereotypes.

13. A motor-kinetic identification apparatus as set forth in claim 12 wherein the magneto metric element has a time variant output state developed as a function of the field, the user stereotype being a time sampling of the output state.

14. A motor-kinetic identification apparatus as set forth in claim 13 wherein the processor is operable to time sample the output state.

15. A motor-kinetic identification apparatus as set forth in claim 12 wherein the material is non-magnetic foam.

16. A motor-kinetic identification apparatus as set forth in claim 12 wherein the source includes strips of magnetic material.

* * * * *